United States Patent [19]

Lillienfeld et al.

[11] Patent Number: 5,087,322

[45] Date of Patent: Feb. 11, 1992

[54] SELECTIVE METALLIZATION FOR HIGH TEMPERATURE SEMICONDUCTORS

[75] Inventors: David Lillienfeld, Ithaca, N.Y.; David Thomas, Milton, Vt.; Paul Smith, Geneva, N.Y.; Gerald Comeau, Burdett, N.Y.; Robert Soave, Cortland, N.Y.

[73] Assignee: Cornell Research Foundation, Inc., Ithaca, N.Y.

[21] Appl. No.: 602,802

[22] Filed: Oct. 24, 1990

[51] Int. Cl.$^5$ .................. H01L 21/306; B44C 1/22; C03C 15/00; C03C 25/06

[52] U.S. Cl. .................. 156/628; 156/643; 156/657; 156/659.1; 156/661.1; 156/662; 427/38; 427/282; 427/309; 437/20; 437/203; 437/228; 437/243; 357/65

[58] Field of Search ............... 156/628, 643, 653, 657, 156/662, 659.1, 661.1; 427/38, 43.1, 282, 301, 309; 430/313, 314, 315, 317; 437/20, 24, 39, 187, 192, 203, 228, 238, 241, 245; 357/15, 65, 67, 71, 91

[56] References Cited

U.S. PATENT DOCUMENTS

| | | | |
|---|---|---|---|
| 4,307,179 | 12/1981 | Chang | 430/314 |
| 4,339,869 | 7/1982 | Reihl | 357/65 X |
| 4,344,980 | 8/1982 | Yoder | 427/38 |
| 4,347,264 | 8/1982 | Lindmayer | 430/314 |
| 4,351,892 | 9/1982 | Davis | 430/30 |
| 4,378,383 | 3/1983 | Moritz | 427/96 |
| 4,383,869 | 5/1983 | Liu | 357/91 X |
| 4,393,577 | 7/1983 | Imai | 357/91 X |
| 4,396,458 | 8/1983 | Platter | 156/643 |
| 4,526,624 | 7/1985 | Tombrello | 427/38 X |
| 4,531,144 | 7/1985 | Holmberg | 357/71 |
| 4,556,628 | 12/1985 | Greschner | 430/314 |
| 4,570,324 | 2/1986 | Smith | 357/67 X |
| 4,581,098 | 4/1986 | Gregor | 156/635 |
| 4,673,968 | 6/1987 | Hieber et al. | 357/71 |
| 4,696,098 | 9/1987 | Yen | 437/187 |
| 4,698,113 | 10/1987 | Ogawa | 156/275.7 |
| 4,746,621 | 5/1988 | Thomas | 437/24 |
| 4,907,066 | 3/1990 | Thomas | 357/71 |

OTHER PUBLICATIONS

Höchst, Electronic Structure and Thermal Stability of Ni/SiC(100) Interfaces, Synchrotron Radiation Center, Univ. of Wis., Apr. 1988.
Rathman, High-Temp. Point-Contact Transistors and Schottky Diodes Formed on Boron-Doped Diamond, IEEE Electron Device Ltrs., vol. EDL 8, No. 4, 1987.
Daimon, Operation of Schottky-Barrier Field-Effect Transistors of 3C-SiC up to 400° C., Electrotechnical Laboratory, Japan, 1987.
Palmour, High-Temperature Depletion-Mode Metal-Oxide-Semiconductor Field-Transistors in Beta-SiC Thin Films, Dept. of Mat. Sci. & Engr., N.C. State University, 1987.
Prins, Bipolar Transistor Action in Ion Implanted Diamond, Nuclear Physics Research Unit, Univ. of Witwatersrand, Rep. of S. Africa, 1982.
Barton, A Two Level Metal CMOS Process ror VLSI Circuits, Semiconductor International, 1985.
Wilson, Highly Selective, High Rate Tungsten Deposition, Materials Research Society, 1985.
Moriya, A Planar Metallization Process-Its Application to Tri-Level, IEDM 83, 550-553.

*Primary Examiner*—William A. Powell
*Attorney, Agent, or Firm*—Jones, Tullar & Cooper, P.C.

[57] ABSTRACT

A method of selective metallization of high temperature semiconductors to produce ohmic or rectifying contacts includes modification of the surface of a high temperature semiconductor material and thereafter depositng metal thereon by chemical vapor deposition. The method includes a lithographic step to define the area on the semiconductor surface where the CVD material is to be deposited. Thereafter, a beam of refractory metal ions is directed onto the defined area to damage the semiconductor material surface so that it will react with CVD gases. The contact metal is then deposited on the damaged surface by chemical vapor deposition, so that the metal seeds on the damaged exposed surface of the semiconductor to permit direct formation of metallization on that surface.

21 Claims, 3 Drawing Sheets

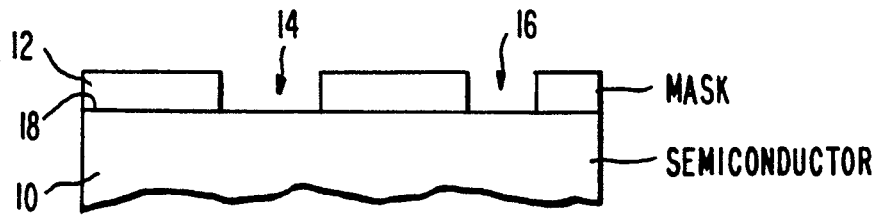
FIG. IA
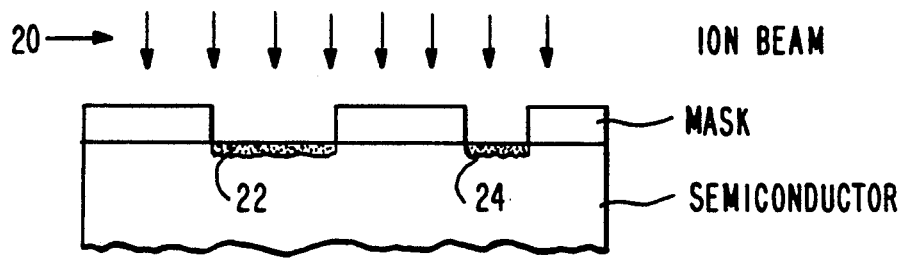
FIG. IB
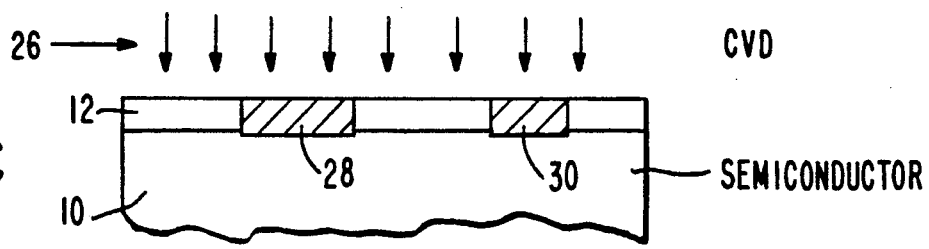
FIG. IC
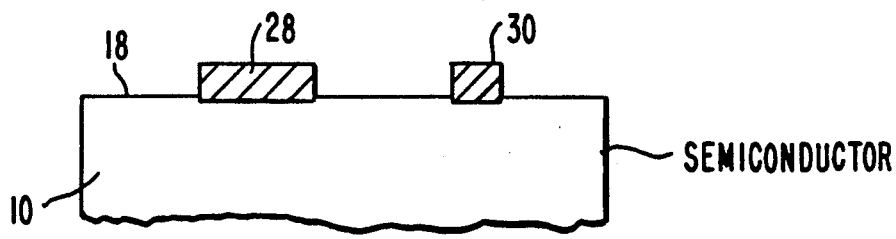
FIG. ID

SELECTIVE METALLIZATION FOR HIGH TEMPERATURE SEMICONDUCTORS

This invention was made with Government support under Grant No. ECS-8619049, awarded by the National Science Foundation. The Government has certain rights in the invention.

BACKGROUND OF THE INVENTION

The present invention relates, in general, to a method of selective metallization of high temperature semiconductors to produce ohmic or rectifying contacts. More particularly, the invention relates to a method of modifying the surface of a high temperature semiconductor material and thereafter depositing metal on the modified surface by chemical vapor deposition to produce the required contact metallization.

High temperature semiconductors; that is, wide-band-gap semiconductors, are promising materials for blue lasers, high frequency, high-power devices, and for high temperature applications such as sensor circuits for automobile engines. However, the contact metallization for high temperature semiconductors must be able to withstand repeated cycling, have good adhesion, and must not react at high temperatures if the devices are to be successfully used. Refractory metals and refractory metal silicides should fulfill the criterion for low reactivity, but problems such as poor adhesion arise due to differences in the thermal properties of the metallization and the substrate.

A promising technique for depositing refractory metals and refractory metal silicides for VLSI applications is selective chemical vapor deposition (CVD). The advantages of this technique are that it will, typically, only deposit refractory metals and refractory metal silicides on silicon, germanium, or metals, but will not deposit these materials on oxides or insulators. Because of this feature, masking a silicon wafer with patterned silicon dioxide will allow the refractory metal or refractory metal silicide to be patterned during deposition. U.S. Pat. Nos. 4,746,621 and 4,907,066 to Thomas et al demonstrated a method for fabricating a multi-level interconnect system using tungsten CVD. In accordance with those patents, silicon was implanted in the bottom of trenches formed in a silicon dioxide layer and after etching the silicon dioxide to expose the implanted silicon, tungsten was deposited on the implanted material in the trenches to form an interconnect line. In this manner, selective CVD tungsten was deposited on silicon dioxide. However, there is also a need to deposit selective CVD metals and/or alloys onto high temperature, wide-band-gap semiconductors.

SUMMARY OF THE INVENTION

The present invention is directed to a method for forming electrical contacts to wide-band-gap semiconductors by selective chemical vapor deposition processes. The method of the invention is used to form either ohmic or Schottky contacts to such semiconductors, so the method must be capable of being selective, wherein only predetermined small areas of a sample will be metallized. Most selective processes do not permit deposition of materials on wide-band-gap semiconductors; however, the present invention utilizes a preliminary processing step which permits a CVD process to occur on these materials. The process consists of three separate phases, including a lithographic step to define the areas on which selective CVD material is to be deposited, preparation of the semiconductor surface so that the selective CVD material will, in fact, deposit on it, and deposition of material by a standard selective CVD process.

More particularly, a lithographic step is used to define the areas on a semiconductor material on which a selective CVD material is to be deposited. Because high temperature semiconductors are not attacked by $WF_6$ or other CVD gases, the CVD metals or CVD refractory metal silicides normally will not seed on the areas of such semiconductor surfaces when exposed in the lithographic step. This problem is overcome by modifying the semiconductor surface in the exposed area by means of an ion beam which damages the surface and allows the CVD gas to react directly with the semiconductor. Alternatively, the ion beam may damage a layer of the semiconductor just below its surface, and this buried layer is then uncovered by etching to leave the exposed semiconductor surface rich in reactive ions which will allow the CVD gas to react with the semiconductor.

A masking material prevents the implant beam from damaging the covered substrate and, if it is to be left in place during the later deposition process, the mask must be stable at the deposition temperature. The masking material may be a single layer of photoresist or may be a multi-layer mask consisting, for example, of a nitride on an oxide layer. Multi-layer masks are useful because the top layer, which might be damaged by the implant step, can be removed, leaving the lower layer of the pattern material on the substrate to protect it and to provide vertical wall definition during the CVD deposition. The mask may be patterned by the use of optical or electron beam lithography.

The final step of the process is the deposition on the exposed surfaces of the substrate of a selective CVD metal, CVD refractory metal, or CVD refractory metal silicide. This material seeds on the damaged exposed surface of the semiconductor and permits the direct formation of a metallization layer on the substrate which can then be used to make ohmic, Shottky, or gate contacts. Thereafter, the masking layer or layers may be removed, if desired.

BRIEF DESCRIPTION OF THE DRAWINGS

The foregoing, and additional objects, features, and advantages of the present invention will become apparent to those of skill in the art from a consideration of the following detailed description of preferred embodiments thereof, taken in conjunction with the accompanying drawings, in which:

FIGS. 1A through 1D illustrate the basic steps of the present invention wherein a single layer mask is utilized and wherein ion beam implantation affects the exposed surface of a substrate;

DESCRIPTION OF PREFERRED EMBODIMENT

Figure 2A:
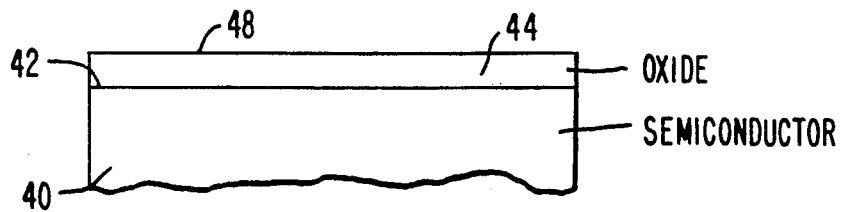
FIGS. 2A through 2G illustrate a modified process wherein multi-layer masking is used and wherein ion beam implantation produces a buried layer in the substrate which is uncovered by etching.
Figure 2B:
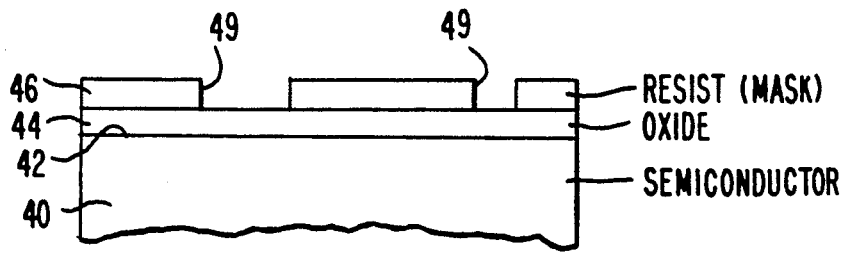

Turning now to a more detailed consideration of the present invention, FIGS. 1A through 1D illustrate the basic steps for producing ohmic or rectifying contacts on high temperature semiconductors. As illustrated in FIG. 1A, the first step involves the formation on a semiconductor substrate 10 of a mask 12 which is formed by conventional lithography to define areas such as those illustrated at 14 and 16 where metal contacts are to be formed on the upper surface 18 of the substrate 10. The semiconductor substrate 10 is a high temperature material such as SiC, $Si_3N_4$, diamond, or BN. These materials are wide-band-gap semiconductors which are suitable for high temperature uses such as blue lasers, high-frequency, high-power devices, and high temperature applications such as sensor circuits for automobile engines. The semiconductor material 10 is of a type which normally is not attacked by $WF_6$ or other CVD gases, and accordingly CVD metals or CVD refractory metal silicides normally will not seed on the top surface 18 of such materials where the surface is exposed, as by the mask 12.

In order to enable the CVD metal or refractory metal silicide to seed on the surface 18, the surface is modified by means of an ion beam, diagrammatically illustrated at 20 in FIG. 1B. This beam strikes the exposed surface 18 in the regions 14 and 16 to produce damaged areas 22 and 24 in the surface of the substrate 10. The ion beam may either produce damaged surface regions such as those illustrated at 22 and 24, or may produce buried layers below the surface 18 of the semiconductor substrate 10, depending upon the materials used and the energy level of the ion beam.

After formation of the implant layers 22 and 24, the refractory material which is to form the metal contact on the substrate is applied by chemical vapor deposition, as indicated by the arrows 26 in FIG. 1C. The CVD step produces metallization layers 28 and 30 in the regions 14 and 16 defined by the mask 12, and this metallization can be used to make either ohmic or Shottky contacts. The deposition process allows the CVD gas to react directly with the semiconductor material in the damaged regions 22 and 24 to insure complete contact between the deposited metal layers 28 and 30 and the substrate 10.

After deposition of the refractory material, the mask layer 12 can be removed in conventional manner, as indicated in FIG. 1D, leaving free standing contacts 28 and 30 on the top surface 18 of substrate 10, thereby completing the metallized semiconductor.

The implant mask material 12 can be one of three types. First, it can be a photoresist or other lithographically definable material which cannot survive a high temperature treatment such as the deposition process illustrated in FIG. 1C. Alternatively, the implant mask material can be an oxide, nitride, oxide/nitride combination, or some other material which is stable at high temperature and which can remain in place during the deposition step and be removed afterward if necessary. A third possibility for the implant mask material is a multilayer structure, such as a resist material on an oxide layer or a nitride layer on an oxide layer. Initially, the mask material serves to define the location of the ion beam implant on the surface 18, but a mask material which can survive the deposition step can also serve to define the area which will receive the CVD deposition structure, and further can provide vertical side walls which define the shape of the CVD deposition structure, and this can be advantageous in some cases.

The ion beam used for the implant illustrated in FIG. 1B will depend upon the material used for the semiconductor substrate 10. Preferably, for substrates of SiC, $Si_3N_4$ and diamond, the ion beam will use ions of silicon, germanium, tungsten, or other refractory metals. For a substrate formed from BN, ions of boron, silicon, germanium, tungsten, or other refractories will be used. The energy of the ion beam is determined by the need to create near-surface regions, such as those illustrated at 22 and 24, that are damaged by the ion beam, or which have a high concentration of the implant species. Thus, the energy selected for the beam will depend on the species chosen, with light ions requiring low energy beams, and heavier ions requiring correspondingly higher energies. The dose provided in the implant region will depend upon the particular implant ion species selected, and will depend upon the implant energy. The higher the energy, the larger the dose required to provide the desired modification of the surface region of the semiconductor. Sputtering by the implant beam will also be a factor in determining the dose necessary to effectively seed the regions 22 and 24.

Figure 2C:
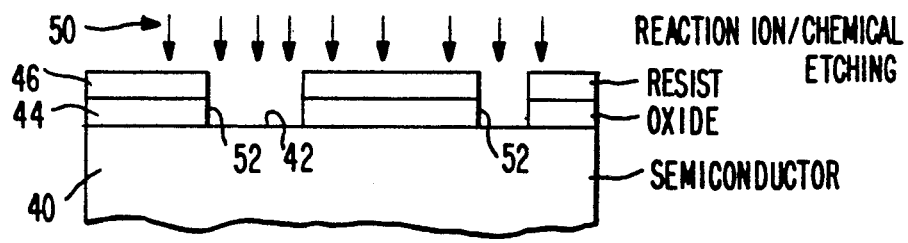

A preferred process is illustrated in FIGS. 2A through 2G, to which reference is now made. As illustrated in FIG. 2A, a substrate 40 is first formed from a semiconductor material having a wide band gap and capable of high temperature applications. The substrate has an upper surface 42 which may be a horizontal flat surface on which is formed an oxide layer 44. The oxide may be grown on the semiconductor surface 42 by PECVD, for example. Thereafter, a photoresist layer 46 (FIG. 2B) is spun on the top surface 48 of the oxide layer 44, is exposed photolithographically, and is developed to form one or more apertures 49 having the location and dimensions of desired implant sites on the semiconductor. As indicated in FIG. 2C, the oxide layer 44 is etched by, for example, reactive ion etching illustrated diagrammatically by arrows 50 to form trenches 52 at least partially through the oxide layer 44. Preferably, the reactive ion etching does not extend completely through layer 44, but the trenches are finished by means of a chemical etch which naturally stops at the semiconductor surface 42.

Figure 2D:
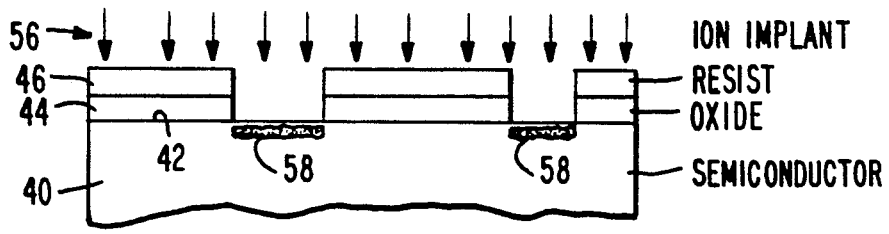
Figure 2E:
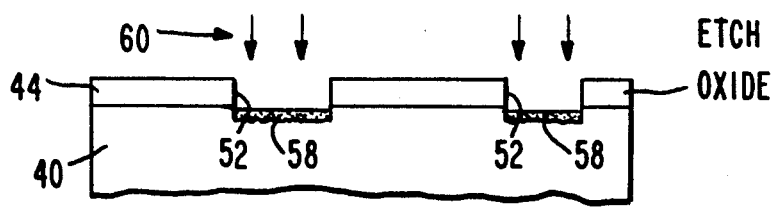
Figure 2F:
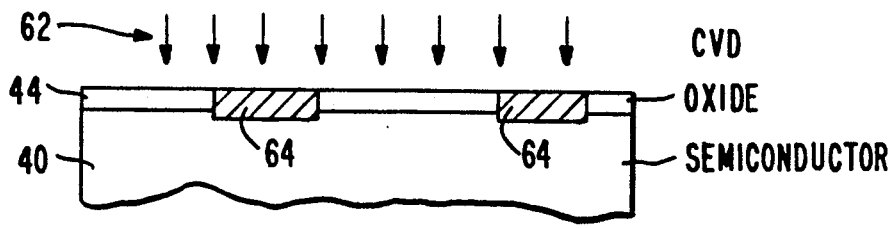
Figure 2G:
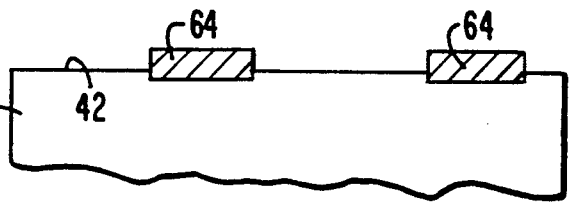

As illustrated in FIG. 2D, the semiconductor material is implanted with ions by means of an ion implant beam generally indicated by the arrows 56. The ions damage the semiconductor material 40 at the implant sites defined by apertures 49 and trenches 52, while the masking material prevents damage to the covered substrate. The depth of the implant sites will depend upon the type of ions and the energy of the ion beam. Thus, as illustrated in FIG. 2D, the modification of the semiconductor material 40 may take the form of a buried layer of ions such as the layers 58 at the implant sites defined by trenches 52. Alternatively, the energy of the beam may be selected to produce the modified layer at the surface 42. As a further alternative, some of the oxide layer 44 may be left in the bottom of trenches 52 after the etching step of FIG. 2C, to cover the surface 42. This layer of oxide would affect the implantation of ions and provide a further control on the depth of the implant sites so that, if desired, the sites could be formed at the surface 42.

Where the ions are implanted slightly below the surface 42 of semiconductor 40, as illustrated in FIG. 2D, or where a thin layer of oxide 44 remains in the trench, the surface 42, or the layer 44, is later etched, as indicated by arrows 60 in FIG. 2E, to expose the implanted material 58 at the bottom of trenches 52. At about the same time, the resist layer 46 may be removed from the top of the oxide material 44. The exposed implanted material 58 is then in a condition to receive metallization to form contacts on the semiconductor substrate 40. This is accomplished by processing the substrate through a chemical vapor deposition reactor, indicated diagrammatically by arrows 62 in FIG. 2F, to fill the trenches 52 with a reactive metal or reactive metal silicide, generally indicated at 64. The trenches 52 in the oxide layer 44 are formed with essentially vertical walls so that the deposited metal contacts 64 have vertical side walls. It will be noted that the deposited material reacts with the ion-rich implanted region 58 to form a unitary contact on the surface of the semiconductor 40, and the region 58 thus disappears. Thereafter, if desired, the oxide layer 44 may be removed from the top surface 42 of the semiconductor 40, as by etching, to leave free standing metal or metal silicide contacts 64 on the surface of the semiconductor. It will be understood that the contacts 64 may be shaped as lines on the surface of the substrate, if desired.

The method of FIGS. 1 and 2 may be utilized to manufacture semiconductor devices such as field effect transistors (FETs) in the manner illustrated in FIGS. 3A through 3D. As there illustrated, an undoped semiconductor substrate 70 is provided which defines the channel region of an FET structure. An oxide layer 72 is grown on the surface 74 of semiconductor material 70, and in the manner described with respect to FIG. 2, a resist layer 76 is provided over the oxide. The resist material is photolithographically exposed and developed to produce apertures 78 and 80 which are in the region of the source and drain electrodes of a field effect transistor. Thereafter, the oxide layer is removed as by reactive ion etching and chemical etching, as described with respect to FIG. 2C, to produce trenches 82 and 84 in alignment with apertures 78 and 80, respectively (see FIG. 3A).

Figure 3A:
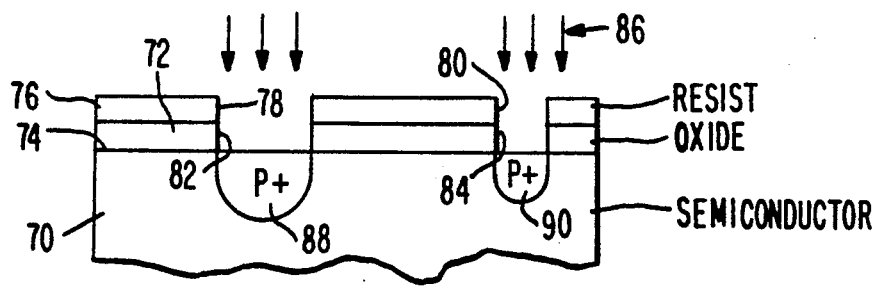
FIGS. 3A through 3D illustrate the use of the process of the present invention in manufacturing a field effect transistor.
Figure 3B:
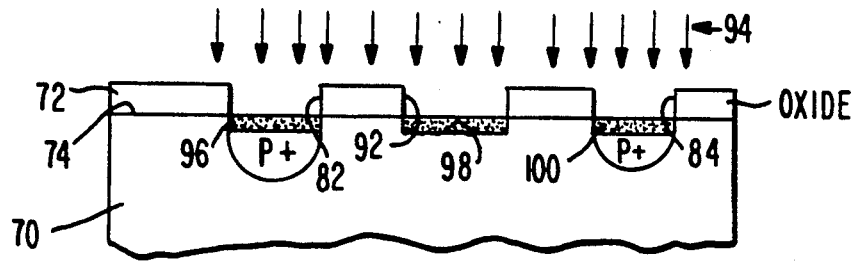
Figure 3C:
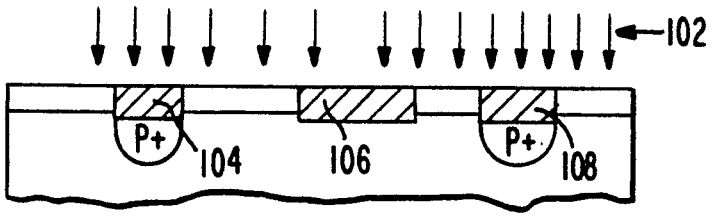
Figure 3D:
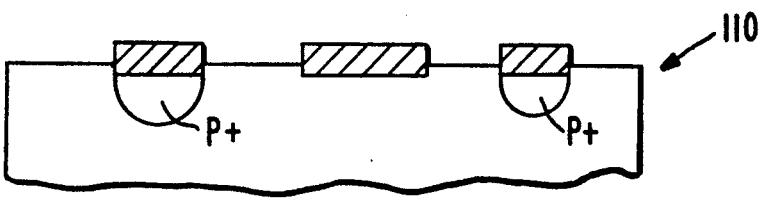

The semiconductor substrate 70 is implanted, as indicated diagrammatically by arrows 86 in FIG. 3A, to form p+ regions 88 and 90 at the locations of trenches 82 and 84, respectively. The material is then annealed to activate the dopants, a new resist layer is applied to the top surface of oxide layer 72 and is patterned to produce an aperture in the resist layer at the location of the gate electrode for the FET device. The oxide layer 72 is then etched to expose the surface 74 of the semiconductor material at a gate trench 92 which defines the location and dimensions of the gate electrode. Thereafter, the surface 74 of the semiconductor material 70 is damaged, or implanted, as by an ion beam indicated diagrammatically at 94 in FIG. 3B, to produce the damaged or implanted regions 96, 98 and 100 at the bottoms of the respective trenches 82, 92 and 84. If the regions 96, 98 and 100 are slightly below the surface of the semiconductor material, then an etching step is provided, as discussed with respect to FIG. 2E, to expose the enriched-ion implanted regions. Thereafter, as indicated at FIG. 3C, a chemical vapor deposition source, indicated by arrows 102, deposits a metal such as tungsten in the trenches 82, 92 and 84 to form contacts 104, 106 and 108, respectively. The deposition of the metal consumes the implant damage caused by the ion implants, leaving the desired contact metallization. If desired, the oxide layer 72 may be removed, leaving the FET device 110 generally indicated in FIG. 3D.

In the foregoing process of forming contact metallization on high temperature semiconductor material, the energy used for ion implantation will depend on the specific ion used. Further, the concentration of ions required in the material will determine the implant dose, although corrections will be needed to take sputtering effects into account, which can alter the effective width of the implant profile.

The effect of sputtering is to widen the implant profile which reduces the maximum concentration. Continued implantation will eventually lead to a steady state concentration of the implant material which is lower than that achieved by a single shorter implant. The sputtering due to the implantation of a heavy ion will be larger than that of a light mass atom. However, the full width at half maximum of the heavy ion implant profile will be significantly less than the full width at half maximum for a light ion implant. The effect of sputtering will be more pronounced for a heavy ion implant because sputtering will have a larger percentage increase in the width of the implant profile, thus having a large effect on the maximum achievable concentration. For light mass implants, the intrinsic width of the profile is larger than for heavy ions and will tend to be changed less by sputtering. So the intrinsic width is the primary limiting factor for light ions. These effects tend to make the maximum achievable concentration similar for both light and heavy mass atoms.

The deposition technique of the present invention thus permits the production of ohmic or rectifying contact metallization on high temperature semiconductors through the provision of ion beam implantation into the substrate onto which the contacts are to be formed. The implant technique promotes adhesion of the contact metallization to the substrate by way of consumption of the implant damage to the substrate during the deposition process. The present invention also permits relatively low implant energies, resulting in narrower damage profiles than are produced by implantations through the metallization layer. This lower damage profile results in fewer defects at the contact interface, with resulting improvements in contact reliability, and leads to improved electrical behavior as well as thermal stability. The use of refractory materials for the metallization has the advantage of providing good resistance to electromigration and permits higher process temperatures. The process also is self aligned and permits high purity depositions, thereby providing significant advantages over prior techniques.

Although the invention has been described in terms of preferred embodiments thereof, it will be apparent that variations and modifications may be made without departing from the true spirit and scope thereof as set forth in the accompanying claims.

What is claimed is:

1. A method of forming contact metallization on high temperature semiconductor material, comprising:
   forming from a wide-band-gap semiconductor material a substrate having a first surface;
   forming a layer of masking material on said first surface;
   patterning said layer;
   removing a selected portion of said layer to expose an implant site on said first surface at the desired location of a metal contact;
   directing an ion beam against said exposed implant site to modify said semiconductor material;
   depositing by chemical vapor deposition a refractory metal on the modified semiconductor material at said implant site, said modified semiconductor material reacting with said refractory material to produce contact metallization of said first surface at said implant site.

2. The method of claim 1, wherein the step of forming a layer of a masking material includes depositing a lithographically definable material on said first surface.

3. The method of claim 1, wherein the step of forming a layer of a masking material includes depositing on said first surface a lithographically definable material which is stable at high temperatures, and which is capable of withstanding said chemical vapor deposition step, and wherein said step of patterning forms vertical walls in said masking material surrounding said implantation site, said walls defining vertical edges of said contact metallization.

4. The method of claim 1, wherein the step of forming a layer of a masking material includes:
depositing on said first surface a first material which is stable at high temperatures, and which is capable of withstanding said chemical vapor deposition step; and
depositing on said first material a lithographically definable second material.

5. The method of claim 4, wherein the step of patterning said layer includes lithographically defining in said second material the location and shape of said implant site.

6. The method of claim 5, wherein the step of removing a selected portion of said layer includes:
removing the lithographically defined portions of said second material; and
etching through said first material in the pattern defined by said second material to form in said first material a trench which exposes said implant site on said first surface.

7. The method of claim 6, further including removing said second material before directing an ion beam against said exposed implant site.

8. The method of claim 7, further including removing said first material from said semiconductor first surface after completion of said chemical vapor deposition.

9. The method of claim 1, wherein the step of directing an ion beam includes directing a beam of ions having an energy level sufficient to damage said semiconductor material at said first surface, whereby said first surface will react with said refractory metal.

10. The method of claim 1, wherein the step of directing an ion beam includes directing a beam of ions having an energy level sufficient to produce a buried layer of implanted ions near said first surface of said semiconductor material.

11. The method of claim 10, further including:
prior to said depositing step, etching said semiconductor first surface to expose said buried layer of implanted ions in said implant site.

12. The method of claim 1, wherein the step of directing an ion beam includes directing a beam of refractory metal ions.

13. The method of claim 1, wherein the step of directing an ion beam includes directing a beam of ions selected from the group B, Si, Ge and W for a substrate material of BN.

14. The method of claim 1, wherein said semiconductor material substrate is formed from a wide-band-gap material selected from the group which includes SiC, $Si_3N_4$, BN and diamond.

15. The method of claim 14, wherein the step of directing an ion beam includes directing a beam of ions selected from the group which includes Si, Ge and W for substrate materials selected from the group which includes SiC, $Si_3N_4$ and Diamond, and includes directing a beam of ions selected from the group which includes B, Si, Ge, and W for a substrate material of BN.

16. The method of claim 15, wherein the step of directing an ion beam includes directing a beam of ions having an energy level sufficient to damage said semiconductor material at said first surface.

17. The method of claim 15, wherein the step of directing an ion beam includes directing a beam of ions having an energy level sufficient to produce a buried layer of implanted ions near said first surface of said semiconductor material.

18. The method of claim 17, further including, prior to said depositing step, etching said semiconductor first surface to expose said buried layer of implanted ions in said implant site.

19. The method of claim 1, wherein in the step of chemical vapor deposition includes depositing contact material which seeds on said modified semiconductor material at said implant site.

20. The method of claim 1, wherein the steps of patterning and removing expose multiple implant sites on said semiconductor first surface.

21. The method of claim 20, wherein the steps of patterning and removing expose source and drain implant sites, and wherein the method further includes:
implanting p+ regions in said semiconductor material at said source and drain implant sites;
annealing said semiconductor material to activate dopants in said source and drain implant sites; patterning and removing a selected portion of said layer to expose a gate implant site;
and thereafter directing said ion beam against said exposed source, gate and drain sites to modify said semiconductor material and to prepare it for said chemical vapor deposition.

* * * * *